United States Patent
Choe

(10) Patent No.: US 8,048,802 B2
(45) Date of Patent: Nov. 1, 2011

(54) METHOD FOR FORMING INTERLAYER INSULATING FILM IN SEMICONDUCTOR DEVICE

(75) Inventor: Ho-Yeong Choe, Jung-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 534 days.

(21) Appl. No.: 12/197,335

(22) Filed: Aug. 25, 2008

(65) Prior Publication Data

US 2009/0057927 A1    Mar. 5, 2009

(30) Foreign Application Priority Data

Sep. 5, 2007  (KR) ..................... 10-2007-0089895

(51) Int. Cl.
*H01L 21/44* (2006.01)
(52) U.S. Cl. ....................... 438/669; 438/725
(58) Field of Classification Search .............. 438/778, 438/669, 725; 216/41–51; 716/50
See application file for complete search history.

(56) References Cited

U.S. PATENT DOCUMENTS

| 5,196,089 A * | 3/1993 | Takada et al. ............. 216/13 |
| 6,487,712 B1 | 11/2002 | Kim |
| 2003/0129548 A1 * | 7/2003 | Kido ........................ 430/327 |

FOREIGN PATENT DOCUMENTS

| JP | 10-144690 A | 5/1998 |
| JP | 2000-082706 | 3/2000 |

* cited by examiner

*Primary Examiner* — Steven Loke
*Assistant Examiner* — Kimberly M Thomas
(74) *Attorney, Agent, or Firm* — Sherr & Vaughn, PLLC

(57) ABSTRACT

A method for forming an interlayer insulating film includes providing a semiconductor substrate having a first substrate region with a plurality of metal wiring and a second substrate region having no metal wiring, and then forming an insulating film dummy pattern in the second substrate region, wherein the insulating film dummy pattern has the same thickness as the metal wiring, and then forming an interlayer insulating film over the semiconductor substrate including the insulating film dummy pattern.

14 Claims, 2 Drawing Sheets

METHOD FOR FORMING INTERLAYER INSULATING FILM IN SEMICONDUCTOR DEVICE

Figure 1:
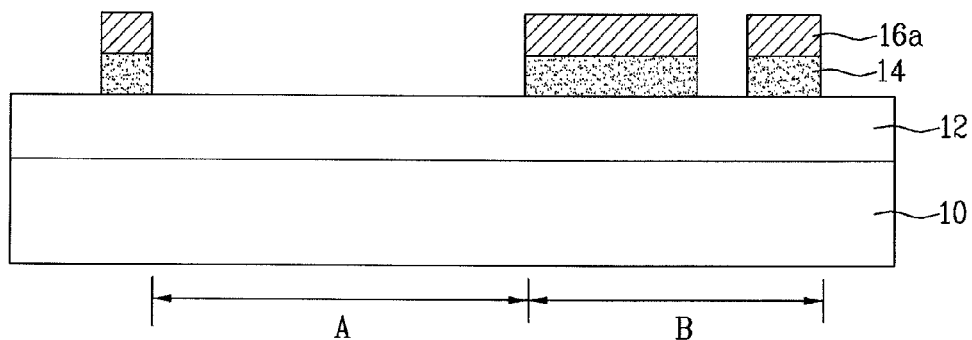

The present application claims priority under 35 U.S.C. §119 to Korean Patent Application No. 10-2007-0089895 (filed on Sep. 5, 2007), which is hereby incorporated by reference in its entirety.

BACKGROUND

Due to increases in capacity and degree of integration of semiconductor devices, semiconductor devices are gradually decreasing in area. Accordingly, to reduce metal wirings in semiconductor devices and a width of the metal wirings in accordance with a reduced area of semiconductor devices, there exists a need for stacked multi-layered metal wirings, i.e., metal wirings that are stacked one above another in multiple layers. Formation of such multi-layered metal wirings essentially necessitates flattening an interlayer insulating film formed on and/or over a lower metal wiring. However, due to the fact that some regions are densely formed with metal wirings, whereas some regions have no metal wirings, flattening, in other words, leveling the uppermost surface, of the interlayer insulating film formed on and/or over the lower metal wiring is difficult. To solve this problem, dummy patterns may be formed in regions having no metal wirings. However, dummy patterns may cause undesirable parasitic capacitance with metal wirings adjacent thereto.

SUMMARY

Embodiments relate to a method for forming an interlayer insulating film in a semiconductor device which can prevent generation of unnecessary parasitic capacitance between a dummy pattern provided in an interlayer insulating film adjacent to a metal wiring.

Embodiments relate to a method for forming an interlayer insulating film in a semiconductor device that can include at least one of the following steps: providing a semiconductor substrate having a first substrate region with a densely formed metal wiring and a second substrate region where no metal wiring is formed; and then forming an insulating film dummy pattern on and/or over the second substrate region; and then forming an interlayer insulating film on and/or over an entire surface of the semiconductor substrate including the insulating film dummy pattern. The insulating film dummy pattern may be formed on the second substrate region having the same thickness as a thickness of the metal wiring.

In accordance with embodiments, the step of forming the insulating film dummy pattern may include at least one of the following steps: reflowing a photoresist pattern remaining on and/or over the metal wiring; and then forming an insulating film on and/or over the entire surface of the semiconductor substrate including the reflowed photoresist pattern; and then removing the insulating film formed on and/or over the reflowed photoresist pattern by lifting off the reflowed photoresist pattern.

Embodiments relate to a semiconductor device that may include at least one of the following: a semiconductor substrate having a first substrate region where a metal wiring is densely formed and a second substrate region where no metal wiring is formed; an insulating film dummy pattern formed on and/or over the second substrate region; and an interlayer insulating film formed on and/or over an entire surface of the semiconductor substrate including the insulating film dummy pattern. The insulating film dummy pattern may have the same thickness as a thickness of the metal wiring, and may be a silicon nitride (SiN) film.

Embodiments relate to a method for forming an interlayer insulating film in a semiconductor device that can include at least one of the following steps: providing a semiconductor substrate having a first substrate region with a plurality of metal wiring and a second substrate region having no metal wiring; and then forming an insulating film dummy pattern in the second substrate region such that the insulating film dummy pattern has the same thickness as the metal wiring; and then forming an interlayer insulating film over the semiconductor substrate including the insulating film dummy pattern.

Embodiments relate to a method that can include at least one of the following steps: forming a first insulating film over a semiconductor substrate having a first substrate region and a second a substrate region; and then sequentially forming a metal layer and a photoresist layer over the first insulating film; and then forming a plurality of metal wiring and a plurality of photoresist patterns on the metal wiring in the first substrate region of the semiconductor substrate by performing a first etching process; and then reducing the viscosity of the photoresist patterns such that the photoresist patterns are reflowed over the uppermost surface and sidewalls of a respective metal wiring; and then reducing the viscosity of the photoresist patterns and then increasing the viscosity of the photoresist patterns; and then forming a second insulating film over the first and second substrate regions after reducing the viscosity of the photoresist patterns; and then forming a second insulating film dummy pattern in the second substrate region by simultaneously removing the photoresist patterns and a portion of the second insulating film formed in the first substrate region.

In accordance with embodiments, a nitride film dummy pattern is formed in a second substrate region where no metal wiring is present such that no stepped portion occurs between the second substrate region and a first substrate region where a metal wiring is densely formed. This can facilitate flattening of an interlayer insulating film that will be deposited subsequently. Moreover, as a result of using the nitride film dummy pattern rather than a metal film dummy pattern, it is possible to prevent generation of an undesirable parasitic capacitance between a metal wiring and the dummy pattern adjacent to the metal wiring.

DRAWINGS

Example FIGS. 1 to 5 illustrate the sequence of a method for forming an interlayer insulating film in a semiconductor device in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

As illustrated in example FIG. 1, first interlayer insulating film 12 is formed on and/or over semiconductor substrate 10 having a variety of devices such as transistors, etc. formed thereon and/or therein. A first metal wiring may be formed in first interlayer insulating film 12 to come into electrical contact with the variety of devices formed on semiconductor substrate 10. After a metal film is formed on and/or over an entire surface of substrate 10 including first interlayer insulating film 12, a photoresist film is formed on and/or over the metal film. The metal film is subjected to a photographic process to thereby form photoresist pattern 16a. Photoresist pattern 16a is used to define a metal wiring. Thereafter, the metal film is etched using photoresist pattern 16a as an etching mask to thereby form second metal wiring 14. Note that a region of substrate 10 where second metal wiring 14 is densely formed is referred to as region B, and a region where no second metal wiring 14 is present is referred to as region A.

Figure 2:
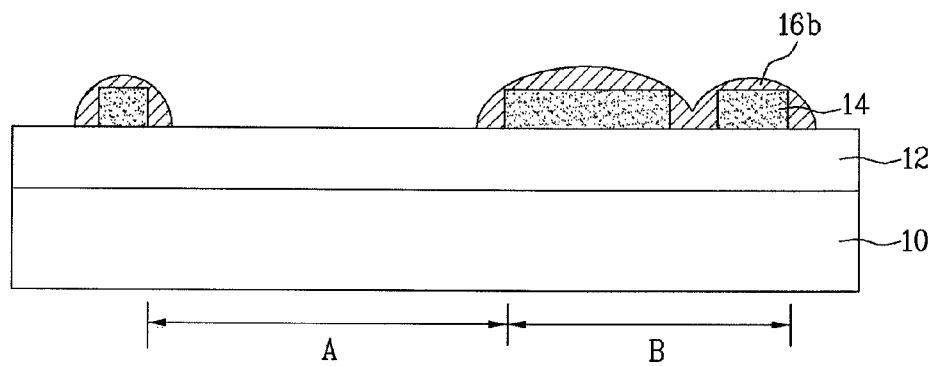

As illustrated in example FIG. 2, substrate 10 including second metal wiring 14 is subjected to a thermal treatment process to reflow photoresist pattern 16a, thereby forming reflowed photoresist pattern 16b on and/or over second metal wiring 14. For example, photoresist pattern 16a, which is located on and/or over second metal wiring 14 to define the metal wiring, may reflow to a substantially curved profile during the thermal treatment process, to thereby cover the uppermost surface and also sidewalls of second metal wiring 14. More particularly, the thermal treatment process reduces a viscosity of photoresist pattern 16a and consequently, increases the mobility of photoresist pattern 16a. Photoresist pattern 16a having an increased mobility falls along the sidewalls of second metal wiring 14 while a portion of photoresist pattern 16a remains on and/or over the uppermost surface of second metal wiring 14. A cooling process is then performed subsequent to the thermal treatment process in order to increase the viscosity of reflowed photoresist pattern 16b in order to shape photoresist pattern 16b in a deformed shape thereof.

Figure 3:
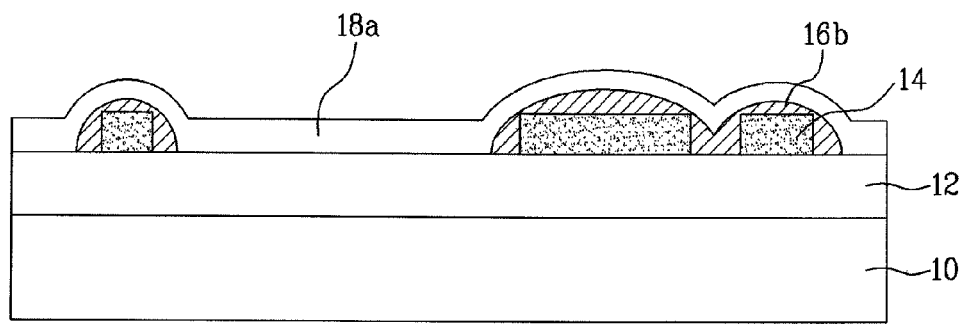

As illustrated in example FIG. 3, silicon nitride (SiN) film 18a as an insulating film, may then be formed on and/or over the entire surface of substrate 10 including reflowed photoresist pattern 16b.

Figure 4:
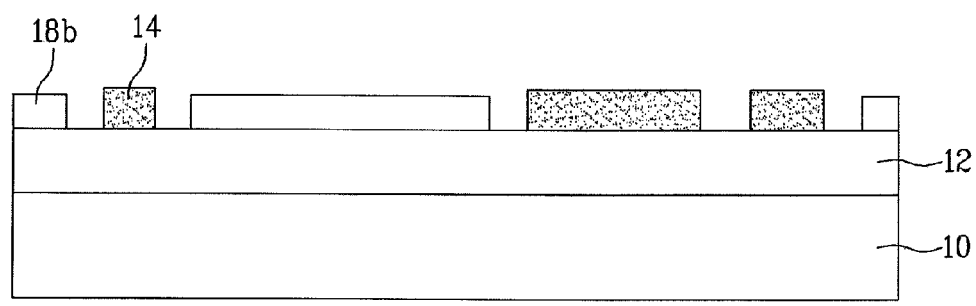

As illustrated in example FIG. 4, reflowed photoresist pattern 16b, formed underneath silicon nitride film 18a, is removed by a lift-off process which also results in the removal of a portion of silicon nitride film 18a. Particularly, the removal of photoresist pattern 16b also removes a portion of silicon nitride film 18a formed in region B while the portion of silicon nitride film 18a formed in region A, i.e., the region where no photoresist pattern 16b is present, still remains to form nitride film pattern 18b serving as a dummy pattern. Typically, once a photoresist pattern is formed on and/or over a semiconductor substrate and in turn, a thin film is deposited on and/or over the semiconductor substrate including the photoresist pattern, a lift-off process is performed to pattern the thin film in such a manner that the thin film is removed in the course of melting the photoresist pattern using a photoresist solvent, and only the thin film deposited on and/or over the semiconductor substrate remains. More particularly, as reflowed photoresist pattern 16b is removed by a photoresist solvent, silicon nitride film 18a formed on and/or over reflowed photoresist pattern 16b is easily lifted off and removed. In this case, silicon nitride film 18a may have a sufficiently thin thickness to allow the photoresist solvent to permeate reflowed photoresist pattern 16b. The reason why silicon nitride film 18a can be easily lifted off and removed is that silicon nitride film 18a has no elasticity and an interface between reflowed photoresist pattern 16b and silicon nitride film 18a is sufficiently thin and weak to be ripped by the photoresist solvent. However, a portion of silicon nitride film 18a formed directly on first interlayer insulating film 12 in region A, i.e., the region where no reflowed photoresist pattern 16b is present, is not removed, thereby forming nitride film pattern 18b as a dummy pattern.

Figure 5:
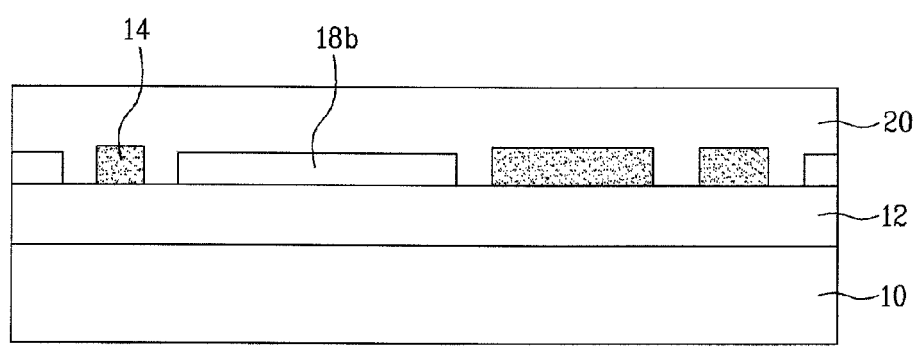

As illustrated in example FIG. 5, second interlayer insulating film 20 may then be formed on and/or over the entire surface of substrate 10 including nitride film pattern 18b, thereby completing the formation of the interlayer insulating film. Accordingly, the semiconductor device in accordance with embodiments includes semiconductor substrate 10 having region B region with densely packed metal wiring and region A where no metal wiring is present, insulating film dummy pattern 18b formed in region A where no metal wiring is present, and interlayer insulating film 20 formed on and/or over the entire surface of semiconductor substrate 10 including region A and region B. Insulating film dummy pattern 18b may have the same thickness as a thickness of metal wiring 14, and may be a silicon nitride film.

In accordance with embodiments, as a result of forming a nitride film dummy pattern 18b in region A where no second metal wiring 14 is present, no stepped portion occurs between region A where no metal wiring is present and region B where the metal wiring is densely formed. This has the effect of facilitating leveling the uppermost surface of the interlayer insulating film that will be deposited subsequently. Moreover, use of nitride film dummy pattern 18b rather than a metal film dummy pattern can prevent generation of an unnecessary parasitic capacitance between the metal wiring and the dummy pattern adjacent to the metal wiring.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming an interlayer insulating film in a semiconductor device comprising:

providing a semiconductor substrate having a first substrate region with a plurality of metal wirings and a second substrate region having no metal wiring;

forming an insulating film dummy pattern in the second substrate region, wherein the insulating film dummy pattern has the same thickness as the metal wiring; and forming an interlayer insulating film over the semiconductor substrate including the insulating film dummy pattern, wherein forming the insulating film dummy pattern comprises:

reflowing a photoresist pattern on the metal wirings; forming a first insulating film over the semiconductor substrate covering the reflowed photoresist pattern on a top surface of each of the metal wirings; and removing the first insulating film formed on the reflowed photoresist pattern.

2. The method of claim 1, wherein providing the semiconductor substrate comprises:

forming a second insulating film on the semiconductor substrate; and then forming the metal wirings on the second insulating film in the first substrate region.

3. The method of claim 1, wherein providing the semiconductor substrate comprises:

forming a metal film on the semiconductor substrate; and then forming the photoresist pattern on the metal film and then performing an etching process on the metal film using the photoresist pattern as an etching mask to form the metal wirings in the first substrate region.

4. The method of claim 1, wherein the first insulating film comprises a silicon nitride (SiN) film.

5. The method of claim 1, wherein reflowing the photoresist pattern comprises performing a thermal treatment process on the photoresist pattern and thereafter hardening the reflowed photoresist pattern such that the reflowed photoresist pattern covers the uppermost surface and sidewalls of the metal wirings.

6. The method of claim 1, wherein forming the insulating film dummy pattern comprises simultaneously removing the reflowed photoresist pattern and the first insulating film in the first substrate region.

7. A method comprising:
  forming a first insulating film over a semiconductor substrate having a first substrate region and a second a substrate region; and then
  sequentially forming a metal layer and a photoresist layer over the first insulating film; and then
  forming a plurality of metal wirings and a plurality of photoresist patterns on the metal wirings in the first substrate region of the semiconductor substrate by performing a first etching process; and then
  reducing the viscosity of the photoresist patterns such that the photoresist patterns are reflowed over the uppermost surface and sidewalls of a respective metal wiring; and then
  increasing the viscosity of the photoresist patterns; and then
  forming a second insulating film over the first and second substrate regions after increasing the viscosity of the photoresist patterns; and then
  forming a second insulating film dummy pattern in the second substrate region by simultaneously removing the photoresist patterns and a portion of the second insulating film formed in the first substrate region.

8. The method of claim 7, wherein reducing the viscosity of the photoresist patterns comprises performing a thermal treatment process on the substrate including the metal wirings and the photoresist patterns.

9. The method of claim 8, wherein the thermal treatment process reflows the photoresist patterns.

10. The method of claim 7, wherein increasing the viscosity of the photoresist patterns comprises performing a cooling process on the substrate including the metal wirings and the photoresist patterns.

11. The method of claim 10, wherein the cooling process hardens the photoresist patterns.

12. The method of claim 7, wherein the second insulating film comprises a silicon nitride (SiN) film.

13. The method of claim 7, further comprising, after forming the second insulating film dummy pattern:
  forming a third insulating film over the first and second substrate regions including the metal wirings and the second insulating film dummy pattern.

14. The method of claim 7, wherein the second insulating film dummy pattern has the same thickness as the metal wirings.

* * * * *